(12) United States Patent
Hoegerl et al.

(10) Patent No.: US 11,217,504 B2
(45) Date of Patent: Jan. 4, 2022

(54) SEMICONDUCTOR PACKAGE WITH PASSIVE ELECTRICAL COMPONENT AND METHOD FOR THE PRODUCTION THEREOF

(71) Applicant: Infineon Technologies AG, Neubiberg (DE)

(72) Inventors: Juergen Hoegerl, Regensburg (DE); Ordwin Haase, Taufkirchen (DE); Tobias Kist, Effeltrich (DE)

(73) Assignee: Infineon Technologies AG, Neubiberg (DE)

( * ) Notice: Subject to any disclaimer, the term of this patent is extended or adjusted under 35 U.S.C. 154(b) by 27 days.

(21) Appl. No.: 16/519,975

(22) Filed: Jul. 23, 2019

(65) Prior Publication Data
US 2020/0035581 A1 Jan. 30, 2020

(30) Foreign Application Priority Data
Jul. 25, 2018 (DE) .......................... 102018212443.4

(51) Int. Cl.
*H01L 23/367* (2006.01)
*H01L 23/433* (2006.01)
(Continued)

(52) U.S. Cl.
CPC ........ *H01L 23/3675* (2013.01); *H01L 21/565* (2013.01); *H01L 23/3107* (2013.01);
(Continued)

(58) Field of Classification Search
CPC ............. H01L 23/3735; H01L 23/4334; H01L 23/49537; H01L 23/49575; H01L 25/162
See application file for complete search history.

(56) References Cited

U.S. PATENT DOCUMENTS

| 8,358,000 | B2 | 1/2013 | Beaupre et al. |
| 8,654,554 | B2 | 2/2014 | Seki |

(Continued)

FOREIGN PATENT DOCUMENTS

| DE | 102014209690 A1 | 11/2015 |
| DE | 112014004147 T5 | 7/2016 |

(Continued)

*Primary Examiner* — Phat X Cao
(74) *Attorney, Agent, or Firm* — Murphy, Bilak & Homiller, PLLC

(57) ABSTRACT

A double-sided coolable semiconductor package includes an upper electrically conductive element having an outwardly exposed metal surface, a lower carrier substrate having an upper electrically conductive layer, a lower electrically conductive layer with an outwardly exposed surface and an electrical insulating layer arranged between the upper and lower electrically conductive layers, a first electrically conductive spacer arranged between the upper electrically conductive element and the upper electrically conductive layer, a power semiconductor chip arranged between the upper electrically conductive element and the upper electrically conductive layer, a second electrically conductive spacer arranged between the upper electrically conductive element and the power semiconductor chip, and a passive electrical component electrically connected to the upper electrically conductive layer of the lower carrier substrate.

21 Claims, 8 Drawing Sheets

(51) Int. Cl.
　　　*H01L 23/373*　　(2006.01)
　　　*H01L 27/06*　　(2006.01)
　　　*H01L 21/56*　　(2006.01)
　　　*H01L 23/31*　　(2006.01)

(52) U.S. Cl.
　　　CPC ...... *H01L 23/3735* (2013.01); *H01L 23/4334* (2013.01); *H01L 27/0647* (2013.01); *H01L 27/0676* (2013.01)

(56) References Cited

U.S. PATENT DOCUMENTS

| | | | |
|---|---|---|---|
| 10,002,821 | B1 | 6/2018 | Hoegerl |
| 10,128,165 | B2 | 11/2018 | Hable et al. |
| 10,348,214 | B2 | 7/2019 | Nakatsu et al. |
| 2007/0090814 | A1* | 4/2007 | Hashimoto ............. H01L 25/16 323/225 |
| 2017/0287875 | A1* | 10/2017 | Gao ........................ H01L 25/50 |
| 2018/0102302 | A1* | 4/2018 | Grassmann ......... H01L 23/4924 |
| 2018/0145007 | A1* | 5/2018 | Hatano ............... H01L 23/3675 |
| 2020/0286865 | A1* | 9/2020 | Chew ..................... H01L 25/18 |

FOREIGN PATENT DOCUMENTS

| | | |
|---|---|---|
| DE | 102016115221 A1 | 2/2018 |
| DE | 102016119485 A1 | 4/2018 |

\* cited by examiner

SEMICONDUCTOR PACKAGE WITH PASSIVE ELECTRICAL COMPONENT AND METHOD FOR THE PRODUCTION THEREOF

TECHNICAL FIELD

The present disclosure relates to a semiconductor package with a double-sided cooling structure and a passive electrical component. The present disclosure also relates to a production method for a semiconductor package with a double-sided cooling structure.

BACKGROUND

The constantly increasing performance requirements that have to be met by electrical circuits for high currents, for example in electrical drives for motor vehicles, require further development and improvement of semiconductor packages that are used in such circuits. Such circuits may for example have inverters, which convert a battery voltage into an AC voltage for the drive of an electric motor. Such an inverter can be realized by a suitable circuit in a semiconductor package, it being crucial with regard to the performance of the inverter to achieve sufficient cooling, the lowest possible impedance, the lowest possible leakage inductances, etc. in the semiconductor package. The performance of such inverters can be increased further by improved semiconductor packages and/or by improved methods for producing such semiconductor packages.

The problem addressed by the invention is solved by the features of the independent patent claims. Advantageous configurations and developments of the invention are specified in the dependent claims.

SUMMARY

Individual examples relate to a semiconductor package with a double-sided cooling structure, the semiconductor package comprising an upper electrically conductive element, which has an outwardly exposed metal surface, a lower carrier substrate, which has an upper electrically conductive layer, a lower electrically conductive layer with an outwardly exposed surface and an electrical insulating layer arranged between the upper and lower electrically conductive layers, a first electrically conductive spacer, which is arranged between the upper electrically conductive element and the upper electrically conductive layer, at least one power semiconductor chip, which is arranged between the upper electrically conductive element and the upper electrically conductive layer, a second electrically conductive spacer, which is arranged between the upper electrically conductive element and the power semiconductor chip, and a passive electrical component, which is electrically connected to the upper electrically conductive layer of the lower carrier substrate.

Individual examples relate to a method for producing a semiconductor package with a double-sided cooling structure, the method comprising providing a lower carrier substrate, which has an upper electrically conductive layer, a lower electrically conductive layer and an electrical insulating layer arranged between the upper and lower electrically conductive layers, applying a first electrically conductive spacer to the upper electrically conductive layer of the lower carrier substrate, applying at least one power semiconductor chip to the upper electrically conductive layer of the lower carrier substrate, applying a second electrically conductive spacer to the power semiconductor chip, applying an upper electrically conductive element on the spacers opposite from the lower carrier substrate, applying power terminals of the semiconductor package to the lower carrier substrate and applying a passive electrical component to the lower carrier substrate or to the power terminals in such a way that the passive electrical component is electrically connected to the upper electrically conductive layer of the lower carrier substrate.

BRIEF DESCRIPTION OF THE DRAWINGS

The accompanying drawings illustrate examples and together with the description serve to explain the principles of the disclosure. The elements in the drawings are not necessarily true to scale with respect to one another. Identical reference signs may designate mutually corresponding, similar or identical parts.

DETAILED DESCRIPTION

In the present description, the expressions "coupled", "electrically coupled" and/or "electrically connected" are not intended to mean that the elements must be directly coupled; intervening elements for example solder layers, may be provided between the "coupled" or "electrically coupled" elements.

Figure 1A:
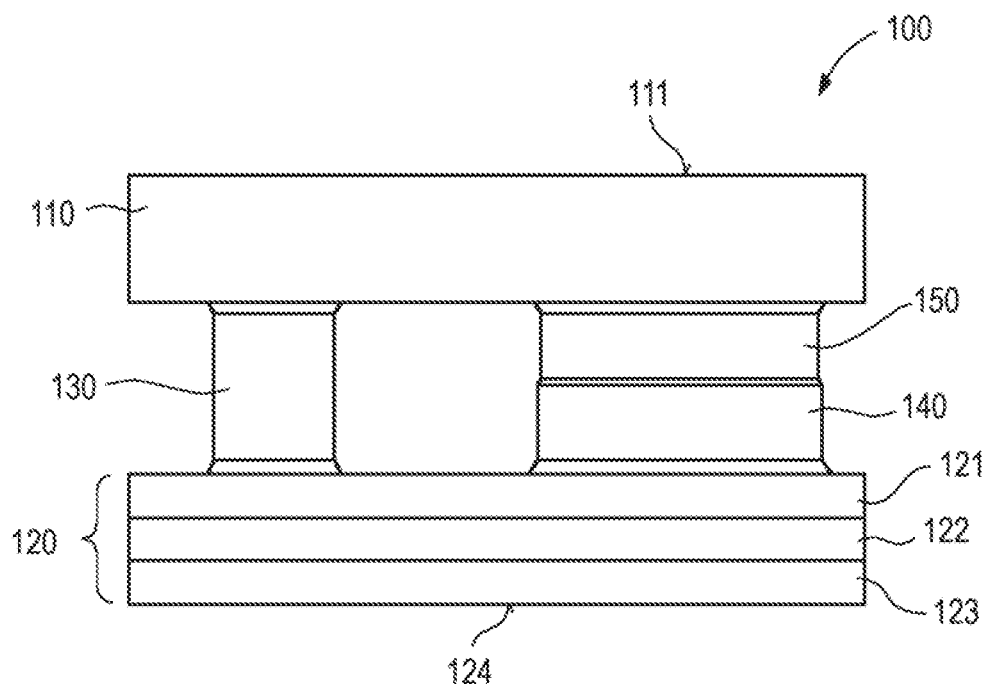
FIG. 1A illustrates a side view of a semiconductor package with a double-sided cooling structure.

FIG. 1A shows a semiconductor package 100 with a double-sided cooling structure according to the disclosure. In this case, "double-sided cooling structure" means that the semiconductor package 100 has an upper electrically conductive element 110 and a lower carrier substrate 120, which can each act as a cooling structure of the semiconductor package 100. The semiconductor package 100 has furthermore a first electrically conductive spacer 130, at least one power semiconductor chip 140 and a second electrically conductive spacer 150. The second electrically conductive spacer 150 is arranged between the upper electrically conductive element 110 and the power semiconductor chip 140.

The lower carrier substrate 120 has an upper electrically conductive layer 121, a lower electrically conductive layer 123 and an electrical insulating layer 122 arranged between the upper 121 and lower 123 conductive layers. The lower carrier substrate 120 may be for example a substrate of the DCB (direct copper bond), DAB (direct aluminum bond), or AMB (active metal brazing) type.

According to one example, the semiconductor package 100 may have furthermore an encapsulation body (not shown), which encapsulates the spacers 130, 150, the at least one power semiconductor chip 140, the upper electrically conductive element 110 and the lower carrier substrate 120. In particular, an interspace between the upper electrically conductive element 110 and the lower carrier substrate 120 may be completely or partly filled by the encapsulation body. However, a metal surface 111 of the upper electrically conductive element 110 and a surface 124 of the lower electrically conductive layer 123 are in any case configured such that they are completely or at least partly outwardly exposed (i.e. the surfaces 111, 124 constitute outer surfaces of the semiconductor package 100).

According to one example, the encapsulation body may comprise or consist of a potting compound or molding compound. The encapsulation body may for example be produced by means of compression molding. To produce the encapsulation body, for example, the as yet unencapsulated semiconductor package 100 may be placed into a molding tool, a dielectric compound may be injected, and the dielectric compound may be cured to form the encapsulation body.

The electrically conductive spacers 130, 150 may consist of a metal or a metal alloy and may for example comprise or consist of Al or Cu. The first electrically conductive spacer 130 is physically and electrically connected to the upper electrically conductive element 110 and the lower carrier substrate 120, for example by solder connections or by electrically conductive adhesive.

According to one example, the at least one power semiconductor chip 140 comprises or consists of SiC. According to one example, the at least one power semiconductor chip 140 is a chip of the IGBT (insulated-gate bipolar transistor) type. According to one example, a half-bridge circuit is realized in the semiconductor package 100. The half-bridge circuit may have a power terminal for a positive supply voltage ($V_{DD}$), a power terminal for a negative supply voltage ($V_{SS}$) and a power terminal formed as a phase.

The second electrically conductive spacer 150 may be electrically connected to an electrode (not shown) of the power semiconductor chip 140 and to the upper electrically conductive element 110, for example by solder connections or by electrically conductive adhesive. The electrode may be a power electrode or a control electrode of the power semiconductor chip 140. The second electrically conductive spacer 150 may completely or partly cover the power semiconductor chip 140.

According to one example, the semiconductor package may have external terminals in the form of terminal fingers. At least some of these external terminals may be designed to electrically connect electrodes of the at least one power semiconductor chip 140 to the outside world. The external terminals may be electrically connected to the upper electrically conductive element 110 and/or to the upper electrically conductive layer 121. The terminal fingers may be parts of a leadframe. Individual terminals from among the external terminals may be power terminals, which may for example be electrically connected to respective power electrodes of the at least one power semiconductor chip 140. One or more of the external terminals may be control terminals, which are electrically connected to a control electrode (for example a gate electrode) of the at least one power semiconductor chip 140. Individual terminals from among the external terminals may be measurement terminals, which are designed for example to measure $V_{DD}$, $V_{SS}$, the voltage of the phase, a current flow or a temperature in the semiconductor package 100.

The semiconductor package 100 has furthermore a passive electrical component, which is electrically connected to the upper electrically conductive layer 121 of the lower carrier substrate 120. The passive electrical component may be applied to the lower carrier substrate 120, for example by a soldered connection. The passive electrical component may be a capacitor, a coil or a resistor, for example a resistor with a negative thermal coefficient. The passive electrical component may be encapsulated by the encapsulation body and may be arranged between the lower carrier substrate 120 and the upper electrically conductive element 110. The passive electrical component may also be arranged outside the encapsulation body, for example on the external terminals. It is also possible that the semiconductor package 100 has more than one passive electrical component.

Figure 1B:
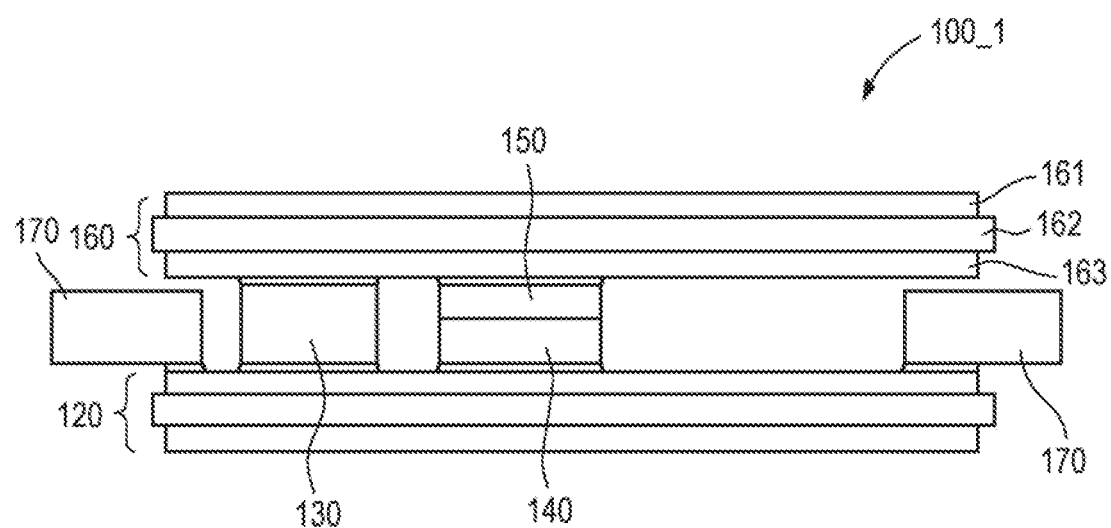
FIG. 1B illustrates a side view of a further semiconductor package with a double-sided cooling structure.

FIG. 1B shows a semiconductor package 100_1, which may correspond to the semiconductor package 100 from FIG. 1A apart from the differences described below. In the case of the semiconductor package 100_1, the upper electrically conductive element 110 has an upper carrier substrate 160 with an upper electrically conductive layer 161, a lower electrically conductive layer 163 and an electrical insulating layer 162, arranged between the upper 161 and lower 163 electrically conductive layers. In this case, the upper electrically conductive layer 161 corresponds to the outwardly exposed metal surface 111.

The semiconductor package 100_1 may have furthermore external terminals 170, which, as shown in FIG. 1B, are arranged between the upper carrier substrate 160 and the lower carrier substrate 120. According to one example, each individual one of the external terminals 170 may be electrically connected to the lower electrically conductive layer 163 of the upper carrier substrate 160 or to the upper electrically conductive layer 121 of the lower carrier substrate 120.

The lower electrically conductive layer 163 of the upper carrier substrate 160 and the upper electrically conductive layer 121 of the lower carrier substrate 120 are structured and may for example have chip islands, conduction tracks and/or application locations for the electrically conductive spacers 130, 150.

Figure 2:
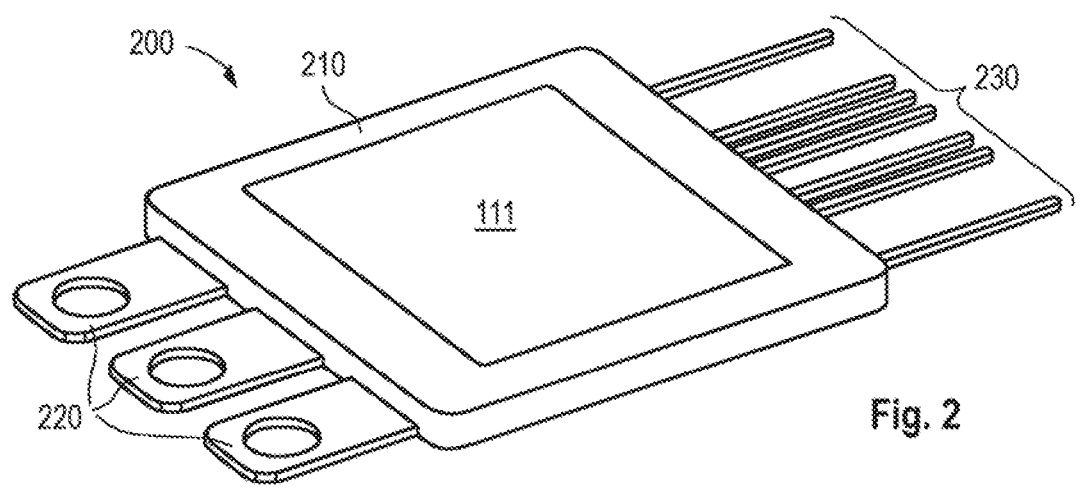
FIG. 2 shows a perspective view of a semiconductor package with a double-sided cooling structure, which comprises furthermore an encapsulation body.

FIG. 2 shows a perspective view of a semiconductor package 200, which may be identical to the semiconductor packages 100 and 100_1. The semiconductor package 200 has an encapsulation body 210, which encapsulates the spacers 130, 150, the upper electrically conductive element 110, the lower carrier substrate 120 and the at least one power semiconductor chip 140. The surfaces 111 and the surface 124 (not visible in FIG. 2) lie on the encapsulation body 210, exposed on opposite sides of the semiconductor package 200.

The encapsulation body 210 consists of a suitable electrically insulating material or comprises such a material, for example a plastic, a polymer or a resin. The encapsulation body 210 may be for example a molded body.

The surface 111 and/or the surface 124 may have an electrically insulating coating and may each be formed for the application of a heat sink.

The semiconductor package 200 has external terminals 220, 230, which are arranged on side surfaces of the semiconductor package 200 that connect the opposite sides to the metal surface 111 and the surface 124. The external terminals 220 may be designed as power terminals and the external terminals 230 may be designed as control terminals or measurement terminals. According to one example, the power terminals 220 are only arranged on one side of the semiconductor package 200 and the control and/or measurement terminals 230 are only arranged on an opposite side. According to another example, a power terminal formed as a phase is arranged on the side with the control or measurement terminals 230. The external terminals 220 and 230 may be parts of a common leadframe.

Figure 3A:
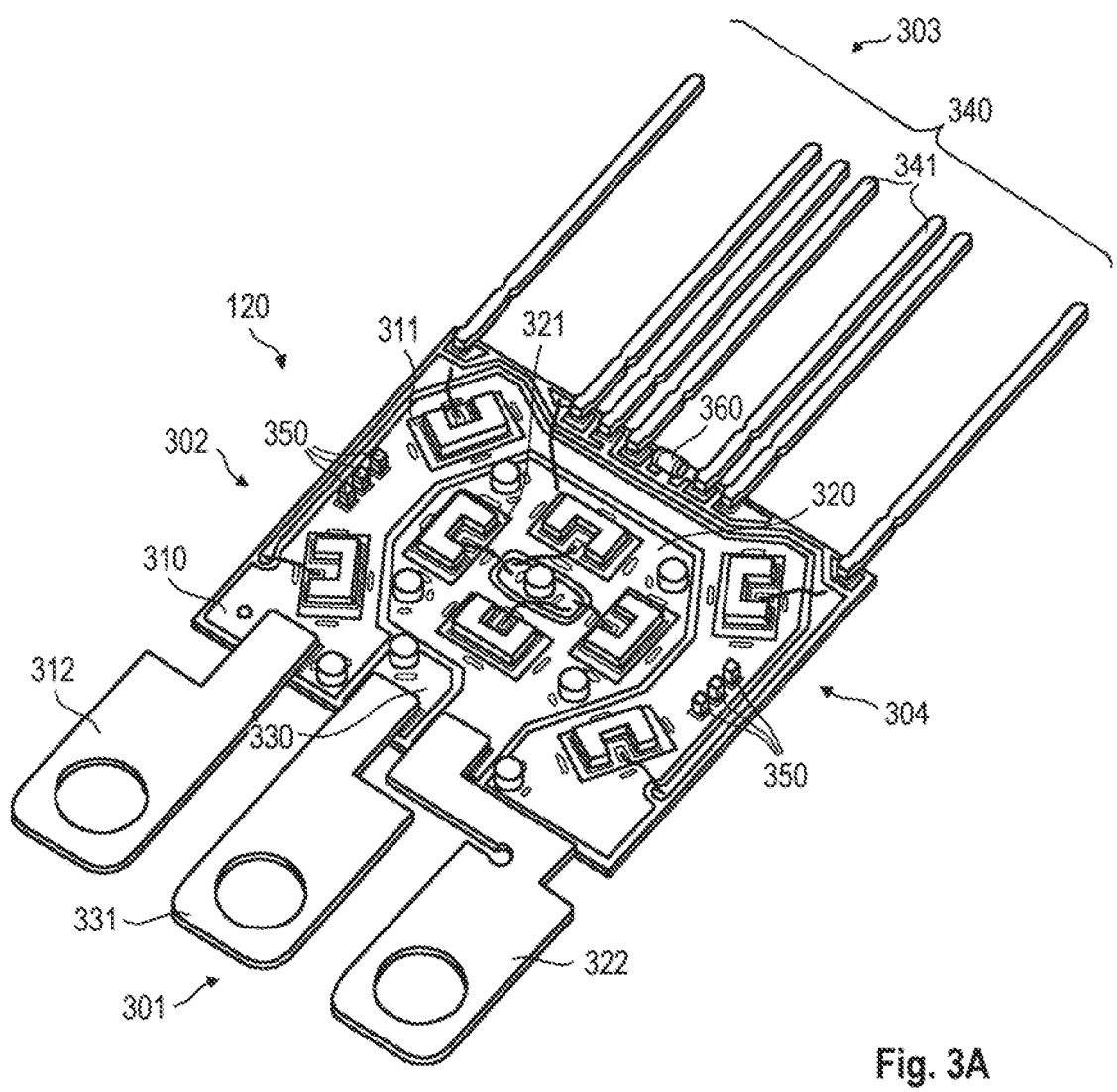
FIG. 3A illustrates an upper cooling structure of a lower carrier substrate of a semiconductor package in a perspective view.

FIG. 3A shows a perspective view of a lower carrier substrate 120 of a semiconductor package 300. The semiconductor package 300 may be identical to the semiconductor packages 100, 100_1 and 200.

The lower carrier substrate 120 may have one or more outer regions 310, an inner region 320 and a terminal region 330. The outer region or regions 310 has/have first power semiconductor chips 311 and the inner region 320 has second power semiconductor chips 321. The first and second power semiconductor chips 311, 321 may be electrically interconnected in such a way that they may create a half-bridge circuit in the semiconductor package 300. For example, the first power semiconductor chips 311 may be high-side power semiconductor chips of the half-bridge circuit and the second power semiconductor chips 321 may be low-side power semiconductor chips of the half-bridge circuit.

The outer region or regions 310 may be designed for example for applying $V_{DD}$, the terminal region 330 may be designed for applying $V_{SS}$ and the inner region 320 may be designed as a phase of the half-bridge circuit. The outer region or regions 310 may be electrically connected to a first power terminal 312, the inner region may be electrically connected to a second power terminal 322 and the terminal region 330 may be electrically connected to a third power terminal 331.

In addition, control or measurement terminals 340, which may be designed for applying a control signal to the first or second power semiconductor chips 311, 321 or for measuring a voltage, a current flow, a temperature etc. in the semiconductor package 300, may be arranged on the lower carrier substrate 120. According to one example, the power terminals 312, 322 and 331 are arranged on a first side 301 and the control and/or measurement terminals 340 are arranged on a third side 303 of the semiconductor package 300 that is opposite from the first side 301. According to another example, it is possible that a power terminal, for example the second power terminal 322 connected to the phase, is arranged on the third side 303 together with the control and/or measurement terminals.

The semiconductor package 300 has furthermore one or more passive electrical components, for example first and second passive electrical components 350 and 360. The first and second passive electrical components 350 and 360 may be for example capacitors, coils or resistors. The first and second passive electrical components may be arranged along an outer periphery of the lower carrier substrate 120, for example along a second side 302, the third side 303 and/or a fourth side 304.

According to one example, the semiconductor package 300 has one or more first passive electrical components 350, which is/are arranged on the outer region 310 and electrically connected to it. The semiconductor package 300 may also additionally or alternatively have one or more first passive electrical components 350, which is/are arranged on the inner region 320 and electrically connected to it. The first passive electrical component or components 350 may be for example capacitors, in particular also buffer capacitors, which are designed to act as damping elements, which suppress undesired oscillations in the half-bridge circuit and improve the electrical properties of the half-bridge circuit. Electrical components 350 designed as buffer capacitors may for example be designed to protect the power semiconductor chips 311 and/or 321.

According to one example, the semiconductor package 300 has one or more second passive electrical components 360. The second passive electrical component or components 360 may be electrically connected to one or more further regions of the upper electrically conductive layer 121, the further region or regions not being connected to one of the regions 310, 320 or 330. According to one example, the second passive electrical component 360 is a resistor with a negative thermal coefficient (NTC) and is connected to measurement terminals 341. At the measurement terminals 341, a voltage drop at the NTC, which depends on the temperature of the semiconductor package 300 at the location of the NTC, can be measured. If the temperature distribution in the semiconductor package 300 is known, for example by computer simulation, in this way it is possible for example to determine the temperature at the location of the power semiconductor chips 311, 321 during the operation of the semiconductor package 300.

Figure 3B:
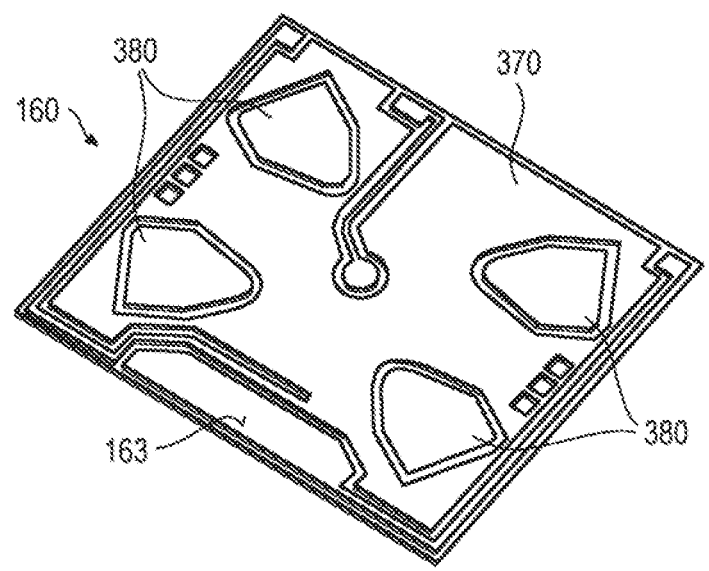
FIG. 3B illustrates the assembled semiconductor package in a perspective view.
Figure 3C:
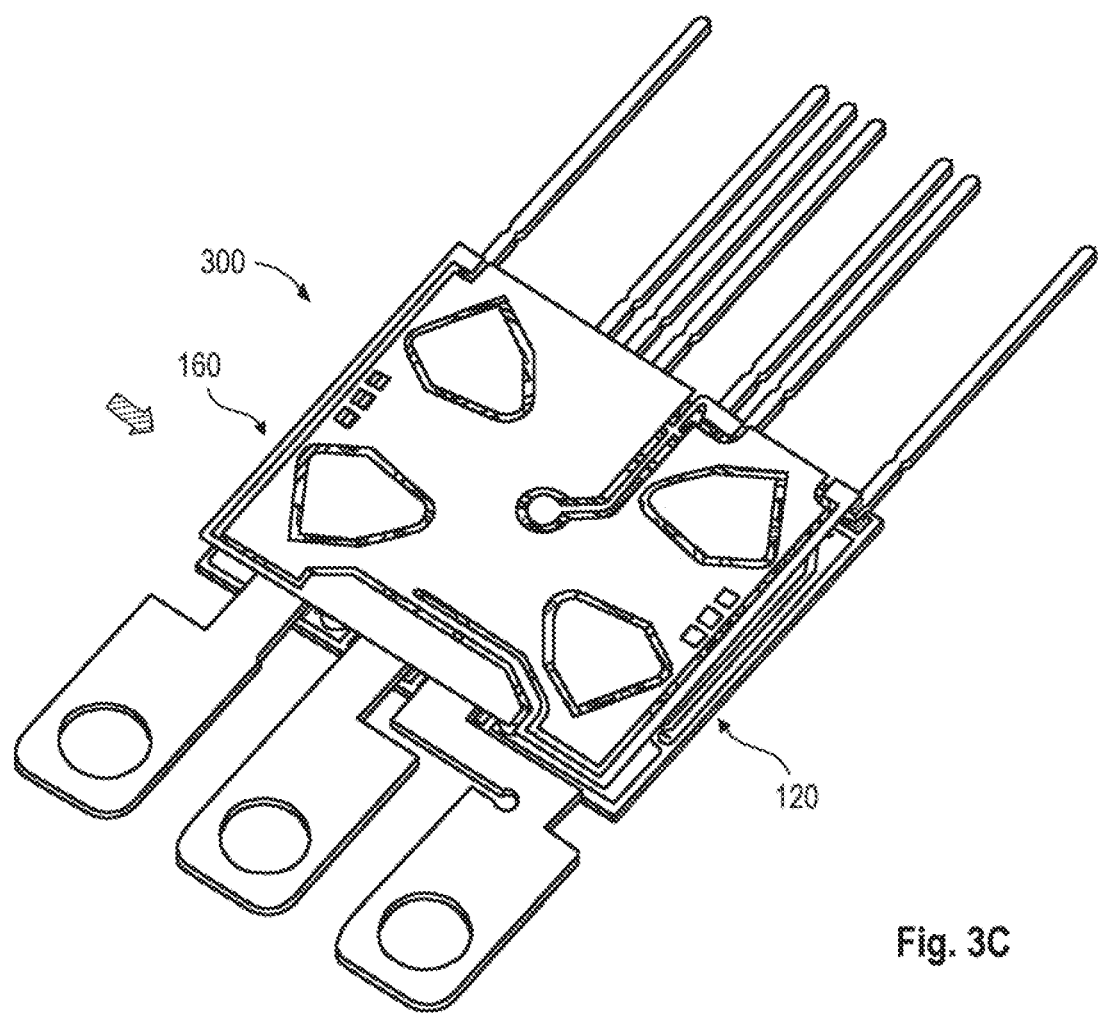
FIG. 3C illustrates a side view of the semiconductor package.

FIG. 3B shows a perspective view of the upper carrier substrate 160 of the semiconductor package 300, FIG. 3C showing a perspective view of the underside of the upper carrier substrate 160 (cf. the arrow in FIG. 3C for the viewing direction).

The lower conductive layer 163 may have a first region 370 and second regions 380. The first region 370 may be electrically connected to the terminal region 330 of the lower carrier substrate 120 and to the second power semiconductor chips 321 (in particular to a power electrode arranged on the upper side of the respective second power semiconductor chip 321). The second regions 380 may be electrically connected to the inner region 320 and to the first power semiconductor chips 311 (in particular to a power electrode arranged on the upper side of the respective first power semiconductor chip 311). The lower conductive layer 163 may have further structured regions, which may for example be configured as control signal lines or as measurement signal lines and may each be connected to one of the control and/or measurement terminals 340.

FIG. 3C shows the semiconductor package 300 after the arrangement of the upper carrier substrate 160 over the lower carrier substrate 120 from FIG. 3A. For the sake of clarity, FIG. 3C shows only the lower conductive layer 163 of the upper carrier substrate 160; the upper electrically conductive layer 161 and the insulating layer 162 have been omitted.

According to one example, the semiconductor package 300 has an encapsulation body (cf. FIG. 2), which for reasons of clarity is not shown in FIG. 3C.

FIG. 3C shows a side view of the semiconductor package 300 along the direction of the arrow in FIG. 3C.

FIGS. 4A through 4D show various possible ways in which a passive electrical component, for example a first or second passive electrical component 350, 360, can be arranged between the lower carrier substrate 120 and the upper carrier substrate 160 in a semiconductor package like the semiconductor packages 100, 100_1, 200 or 300.

Figure 4A:
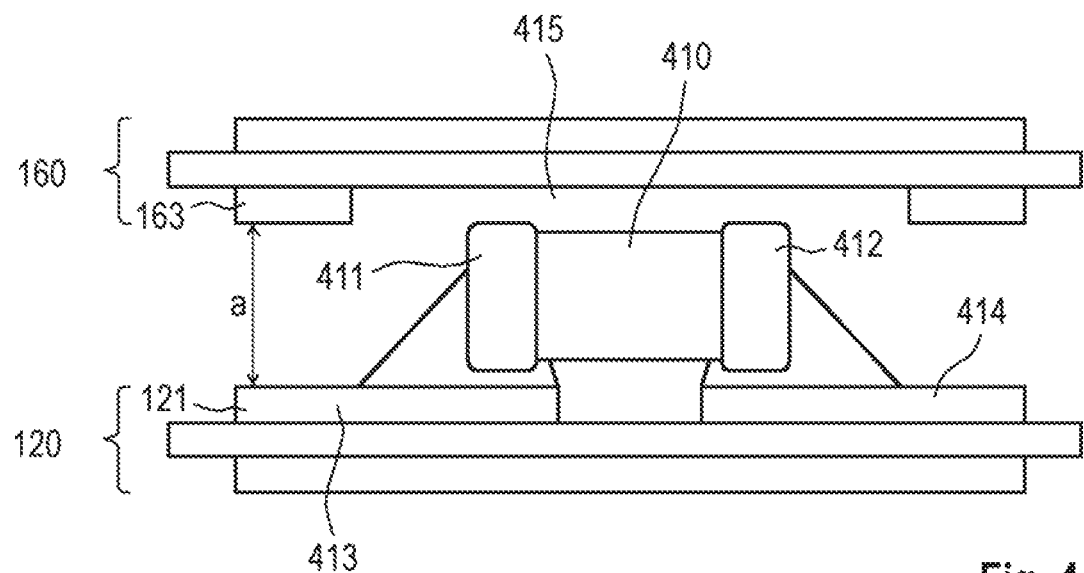
FIGS. 4A to 4D illustrate further possibilities for integrating passive electrical components in a semiconductor package.

FIG. 4A shows a passive electrical component 410, which is applied to the lower carrier substrate 120. The passive electrical component 410 is connected to the upper electrically conductive layer in such a way that a first input/output 411 of the passive electrical component 410 is connected to a first structured region 413 and a second input/output 412 of the passive electrical component 410 is connected to a second structured region 414, so that a current flow can take place from the first structured region 413 via the passive electrical component 410 to the second structured region 414.

According to one example, the passive electrical component 410 may be arranged in a clearance 415 in the lower electrically conductive layer 163 of the upper carrier substrate 160. Such a clearance 415 can contribute to reducing the distance a between the lower and upper carrier substrates 120, 160 that is required for accommodating the passive electrical component 410. The clearance 415 may be configured in such a way that, in the clearance 415, the lower electrically conductive layer 163 has been completely or only partly removed or else thinned.

Figure 4B:
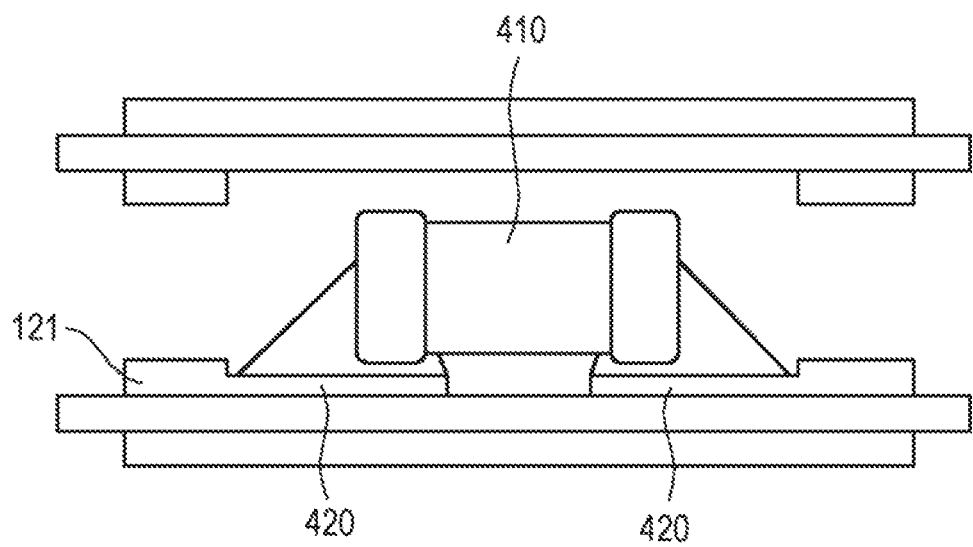

As shown in FIG. 4B, the upper electrically conductive layer 121 may also have thinned regions 420 at the location of the passive electrical component 410. The thinned regions 420 can likewise contribute to reducing the required distance a.

Figure 4C:
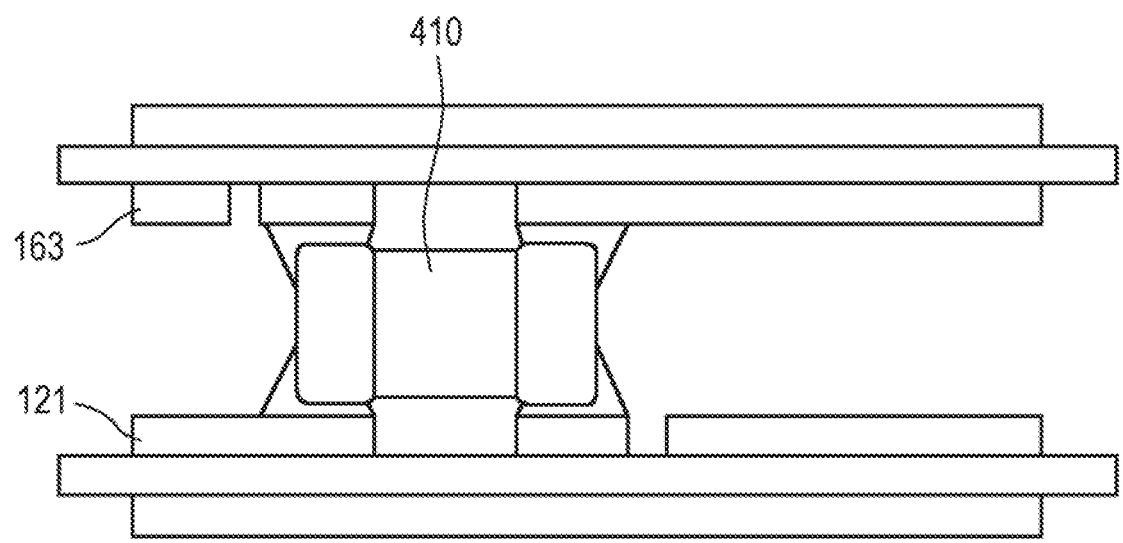

As shown in FIG. 4C, the passive electrical component 410 may also be electrically connected both to the lower carrier substrate 120 (in particular to the upper electrically conductive layer 121) and to the upper carrier substrate 160 (in particular to the lower electrically conductive layer 163).

Figure 4D:
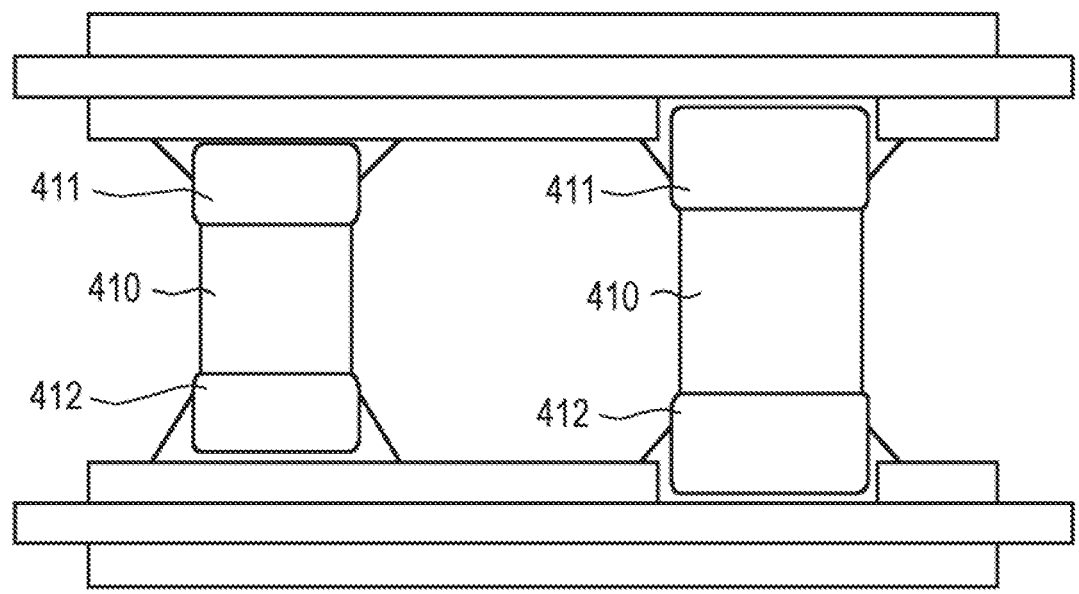

The arrangements of the passive electrical component 410 shown in FIGS. 4A to 4C may be referred to as "horizontal" arrangements, since the arrangement of the two inputs/outputs 411, 412 is parallel to the plane of the upper conductive layer 121 and/or of the lower conductive layer 163. FIG. 4D on the other hand shows "vertical" arrangements, i.e. the arrangement of the inputs/outputs is perpendicular to the plane of the upper conductive layer 121 and/or of the lower conductive layer 163.

As shown on the right side of FIG. 4D, it is also possible in the case of a vertical arrangement to arrange the passive electrical component 410 in a clearance in the upper electrically conductive layer 121 and/or the lower electrically conductive layer 163. A connection of the passive electrical component to the electrically conductive layers 121, 163 may take place for example laterally by correspondingly dimensioned solder depots.

FIGS. 4A to 4C show examples of how a passive electrical component can be arranged between the lower and upper carrier substrates 120, 160. A passive electrical component arranged in such a way is encapsulated by an encapsulation body of the semiconductor package. It is however also possible to arrange a passive electrical component of a semiconductor package outside the carrier substrates 120, 160, for example on the external terminals.

Figure 5A:
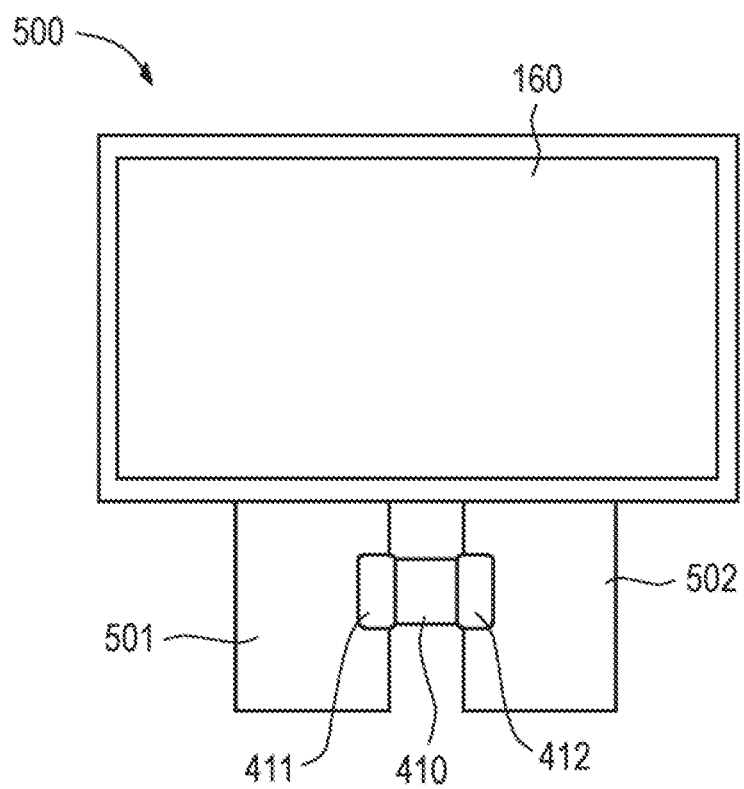
FIG. 5A illustrates a plan view of a semiconductor package with a passive electrical component, which is arranged on external terminals.

FIG. 5A shows a plan view of a semiconductor package 500, which may correspond to the semiconductor packages 100, 100_1, 200 or 300. For the sake of clarity, only two external terminals 501, 502 of the semiconductor package 500 are shown in FIG. 5A; the other external terminals have been omitted. One passive electrical component 410 may be applied on the external terminals 501, 502. A first input/output 411 may be electrically connected to the first external terminal 501 and a second input/output 412 may be electrically connected to the second external terminal 502. The two external terminals 501, 502 may be power terminals of the semiconductor package 500. The first external terminal 501 may for example be designed for applying $V_{DD}$ and the second external terminal 502 may for example be designed for applying $V_{SS}$.

The passive electrical component 410 may be for example a buffer capacitor, which is designed to compensate for fluctuations in $V_{SS}$ and $V_{DD}$. The passive electrical component 410 may be for example a damping element, which is designed to compensate for fluctuations in $V_{SS}$ and $V_{DD}$. As a result, for example, a component connected to the external terminals 501, 502 may be protected from undesired voltage fluctuations.

Figure 5B:
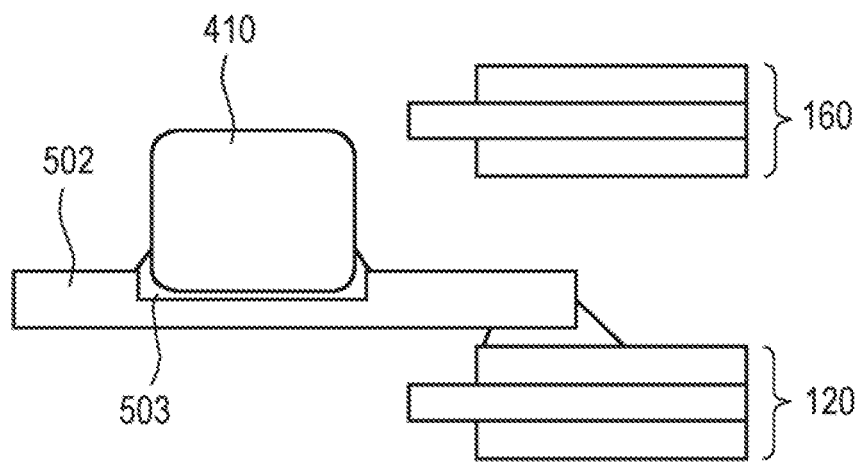
FIG. 5B illustrates a side view of the semiconductor package from FIG. 5A.

FIG. 5B shows a side view of part of the semiconductor package 500. As shown in FIG. 5B, the passive electrical component 410 may be arranged over a surface of the external terminals 501, 502. The passive electrical component 410 may be arranged in a recess 503 in the surface of the external terminals 501, 502. The recess 503 may be designed as a solder resist structure.

Figure 5C:
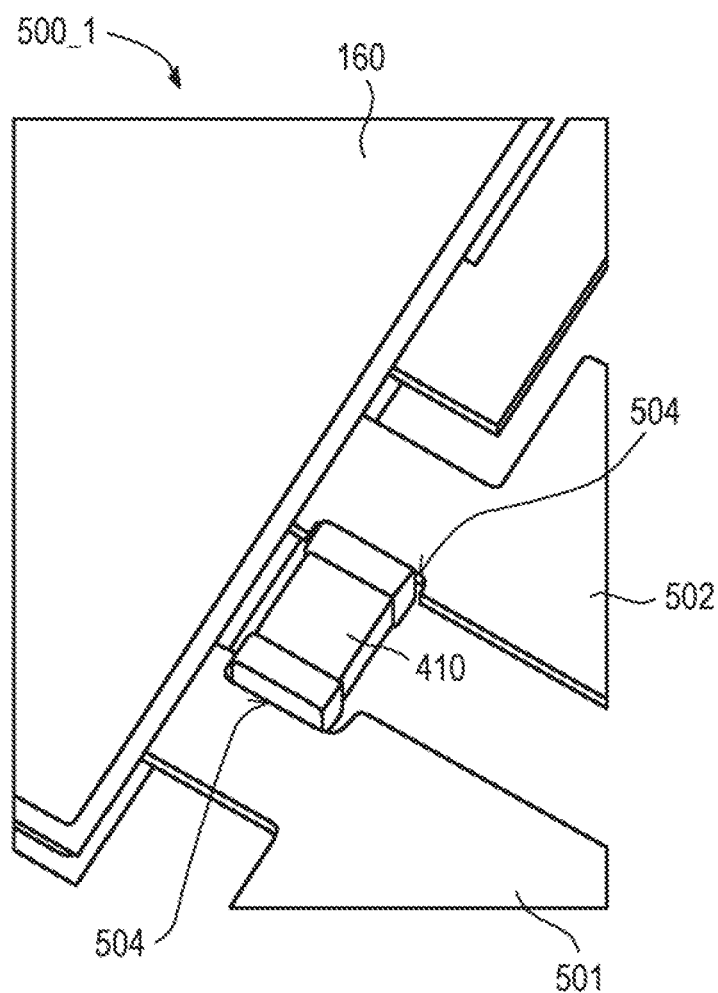
FIG. 5C illustrates a perspective view of a further semiconductor package with a passive electrical component, which is arranged between external terminals.

FIG. 5C shows a perspective view of part of a further semiconductor package 500_1, which may correspond to the semiconductor packages 100, 100_1, 200, 300 or 500. As a difference from the semiconductor package 500, the passive electrical component 410 in the semiconductor package 500_1 is not arranged on a surface of the external terminals 501, 502, but between the external terminals 501, 502. Therefore, the passive electrical component protrudes upward and downward beyond the external terminals 501, 502 (cf. the side view in FIG. 5D).

As shown in FIG. 5C, an indentation 504, in which the passive electrical component 410 is arranged, may be provided on the external terminals 501, 502.

Figure 5D:
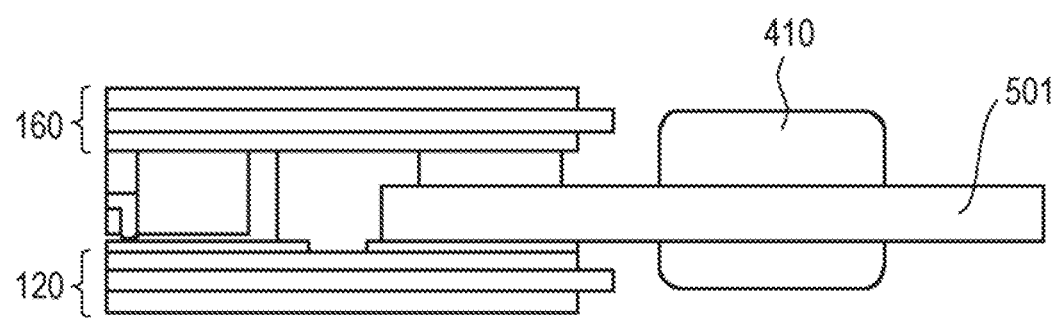
FIG. 5D illustrates a side view of the semiconductor package from FIG. 5C.

FIG. 5D shows a side view of part of the semiconductor package 500_1.

Figure 6:
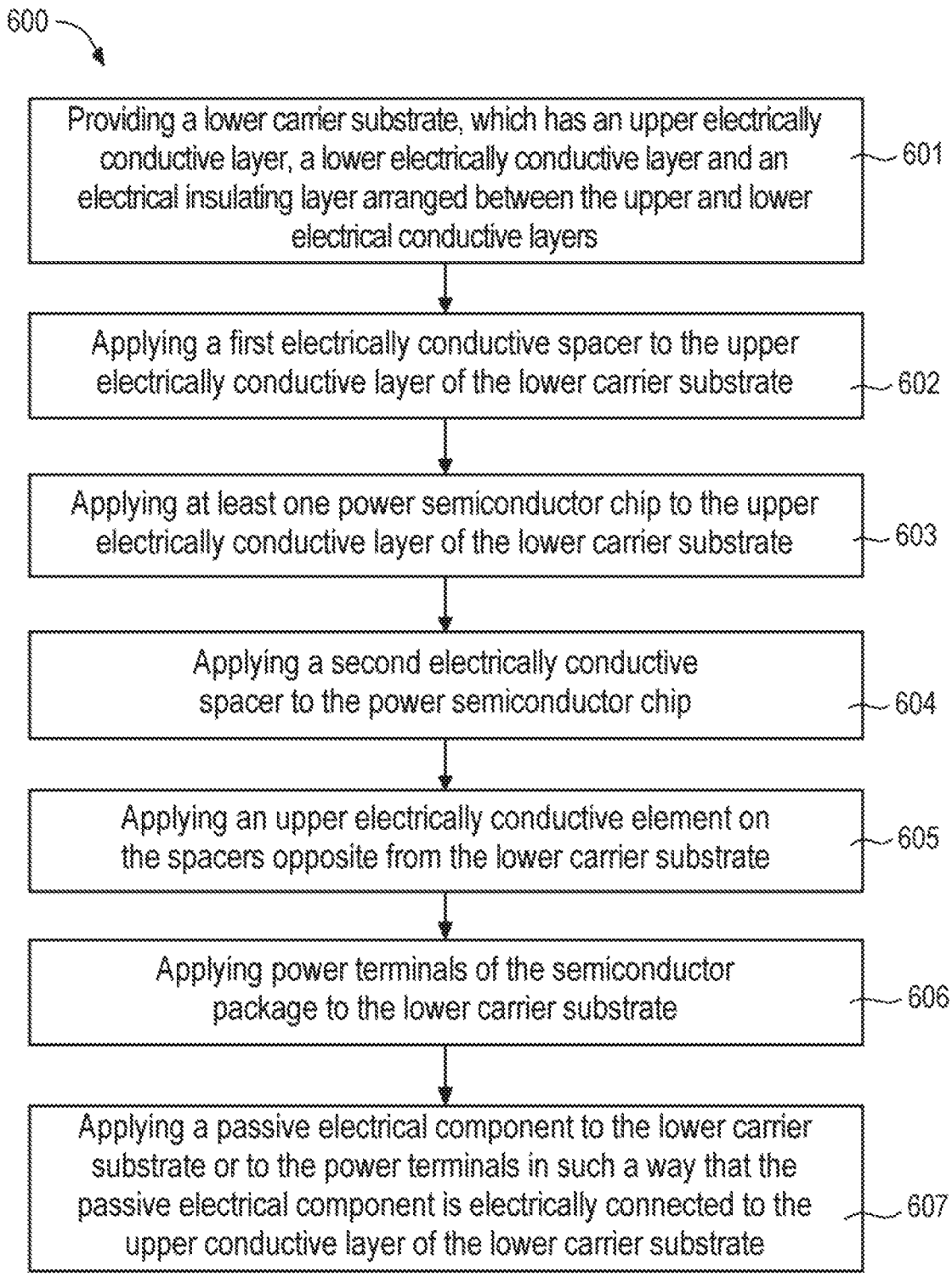
FIG. 6 shows a flow diagram of a method for producing a semiconductor package.

FIG. 6 shows a flow diagram of a method 600 for producing a semiconductor package with a double-sided cooling structure. According to the method 600, for example, the semiconductor packages 100, 100_1, 200, 300, 500 and 500_1 can be produced.

The method 600 comprises, at 601, providing a lower carrier substrate, which has an upper electrically conductive layer, a lower electrically conductive layer and an electrical insulating layer arranged between the upper and lower electrically conductive layers. The method 600 comprises, at 602, applying a first electrically conductive spacer to the upper electrically conductive layer of the lower carrier substrate. The method 600 comprises, at 603, applying at least one power semiconductor chip to the upper electrically conductive layer of the lower carrier substrate. The method 600 comprises, at 604, applying a second electrically conductive spacer to the power semiconductor chip. The method 600 comprises, at 605, applying an upper electrically conductive element on the spacers opposite from the lower carrier substrate. The method 600 comprises, at 606, applying power terminals of the semiconductor package to the lower carrier substrate. The method 600 comprises, at 607, applying a passive electrical component to the lower carrier substrate or to the power terminals in such a way that the passive electrical component is electrically connected to the upper electrically conductive layer of the lower carrier substrate.

The method 600 may furthermore comprise electrically connecting the at least one power semiconductor chip to the upper conductive element and to the upper conductive layer of the lower carrier substrate. The method 600 may comprise furthermore that the application of the passive electrical component comprises soldering of the passive electrical component onto the upper conductive layer of the lower carrier substrate or onto the power terminals. The method 600 may comprise furthermore encapsulating the power semiconductor chip, the spacers, the upper electrically conductive element and the lower carrier substrate in an encapsulation body.

Although specific embodiments have been illustrated and described herein, it is obvious to a person of average skill in the art that a multiplicity of alternative and/or equivalent implementations can replace the specific embodiments shown and described without departing from the scope of the present disclosure. This application is intended to cover all adaptations or variations of the specific embodiments discussed herein. Therefore, the intention is for this disclosure to be restricted only by the claims and the equivalents thereof.

What is claimed is:

1. A double-sided coolable semiconductor package, comprising:
    an upper electrically conductive element having an outwardly exposed metal surface;
    a lower carrier substrate having an upper electrically conductive layer, a lower electrically conductive layer with an outwardly exposed surface, and an electrical insulating layer arranged between the upper and lower electrically conductive layers;
    a first electrically conductive spacer arranged between the upper electrically conductive element and the upper electrically conductive layer;
    a power semiconductor chip arranged between the upper electrically conductive element and the upper electrically conductive layer;
    a second electrically conductive spacer arranged between the upper electrically conductive element and the power semiconductor chip; and
    a capacitor electrically connected to the upper electrically conductive layer of the lower carrier substrate,
    wherein the capacitor is arranged on a region of the upper electrically conductive layer that is formed for applying a positive supply voltage or a negative supply voltage,
    wherein the upper electrically conductive layer of the lower carrier substrate comprises a first depression formed by a first locally thinned section of the upper electrically conductive layer of the lower carrier substrate, and
    wherein the capacitor is disposed within the first depression.

2. The double-sided coolable semiconductor package of claim 1, wherein the upper electrically conductive element comprises an upper carrier substrate with an upper electrically conductive layer, a lower electrically conductive layer, and an electrical insulating layer arranged between the upper and lower electrically conductive layers, and wherein the upper electrically conductive layer corresponds to the outwardly exposed metal surface.

3. The double-sided coolable semiconductor package of claim 1, wherein the capacitor is arranged over the electrical insulating layer of the lower carrier substrate.

4. The double-sided coolable semiconductor package of claim 1, wherein the capacitor is arranged along an outer peripheral region of the lower carrier substrate.

5. The double-sided coolable semiconductor package of claim 1, wherein the capacitor is a buffer capacitor arranged between the lower carrier substrate and the upper electrically conductive element.

6. The double-sided coolable semiconductor package of claim 5, wherein the buffer capacitor is electrically connected to the upper electrically conductive layer of the lower carrier substrate and to the upper electrically conductive element.

7. The double-sided coolable semiconductor package of claim 6, wherein the buffer capacitor is arranged vertically in the double-sided coolable semiconductor package such that a first input/output of the buffer capacitor points toward the upper electrically conductive element and an opposite second input/output of the buffer capacitor points toward the lower carrier substrate.

8. The double-sided coolable semiconductor package of claim 1, further comprising:
    an encapsulation body which encapsulates the power semiconductor chip, the first electrically conductive spacer, the second electrically conductive spacer, the upper electrically conductive element and the lower carrier substrate,
    wherein the encapsulation body comprises a molding compound.

9. The double-sided coolable semiconductor package of claim 8, wherein the capacitor is inside the encapsulation body.

10. The double-sided coolable semiconductor package of claim 1, wherein the power semiconductor chip comprises SiC.

11. The double-sided coolable semiconductor package of claim 1, wherein a half-bridge circuit is realized in the double-sided coolable semiconductor package.

12. The double-sided coolable semiconductor package of claim 1, wherein the upper electrically conductive layer of the lower carrier substrate comprises a second depression formed by a second locally thinned section of the upper electrically conductive layer of the lower carrier substrate, wherein the second depression is separated from the first depression by a gap in the upper electrically conductive layer of the lower carrier substrate, and wherein the capacitor is disposed within the second depression and extends across the gap.

13. A double-sided coolable semiconductor package, comprising:
    an upper electrically conductive element having an outwardly exposed metal surface;
    a lower carrier substrate having an upper electrically conductive layer, a lower electrically conductive layer with an outwardly exposed surface, and an electrical insulating layer arranged between the upper and lower electrically conductive layers;
    a first electrically conductive spacer arranged between the upper electrically conductive element and the upper electrically conductive layer;
    a power semiconductor chip arranged between the upper electrically conductive element and the upper electrically conductive layer;
    a second electrically conductive spacer arranged between the upper electrically conductive element and the power semiconductor chip; and
    a capacitor electrically connected to the upper electrically conductive layer of the lower carrier substrate,
    wherein the upper electrically conductive element comprises an upper carrier substrate with an upper electrically conductive layer, a lower electrically conductive layer, and an electrical insulating layer arranged between the upper and lower electrically conductive layers, the upper electrically conductive layer corresponding to the outwardly exposed metal surface,
    wherein the capacitor is arranged in an indentation formed in the upper electrically conductive element such that the lower conductive layer of the upper carrier substrate has been completely removed in the indentation.

14. The double-sided coolable semiconductor package of claim 13, further comprising:
an encapsulation body which encapsulates the power semiconductor chip, the first electrically conductive spacer, the second electrically conductive spacer, the upper electrically conductive element and the lower carrier substrate,
wherein the encapsulation body comprises a molding compound.

15. The double-sided coolable semiconductor package of claim 14, wherein the capacitor is inside the encapsulation body.

16. The double-sided coolable semiconductor package of claim 13, wherein the power semiconductor chip comprises SiC.

17. The double-sided coolable semiconductor package of claim 13, wherein a half-bridge circuit is realized in the double-sided coolable semiconductor package.

18. A method for producing a double-sided coolable semiconductor package, the method comprising:
providing a lower carrier substrate having an upper electrically conductive layer, a lower electrically conductive layer, and an electrical insulating layer arranged between the upper and lower electrically conductive layers;
applying a first electrically conductive spacer to the upper electrically conductive layer of the lower carrier substrate;
applying a power semiconductor chip to the upper electrically conductive layer of the lower carrier substrate;
applying a second electrically conductive spacer to the power semiconductor chip;
applying an upper electrically conductive element on the first electrically conductive spacer and the second electrically conductive spacer opposite from the lower carrier substrate;
applying power terminals of the double-sided coolable semiconductor package to the lower carrier substrate; and
applying a capacitor to the lower carrier substrate such that the capacitor is electrically connected to the upper electrically conductive layer of the lower carrier substrate,
wherein the capacitor is applied on a region of the upper electrically conductive layer that is formed for applying a positive supply voltage or a negative supply voltage,
wherein the upper electrically conductive layer of the lower carrier substrate comprises a depression formed by a locally thinned section of the upper electrically conductive layer of the lower carrier substrate, and
wherein the capacitor is disposed within the depression.

19. The method of claim 18, further comprising:
electrically connecting the power semiconductor chip to the upper conductive element and to the upper conductive layer of the lower carrier substrate.

20. The method of claim 18, wherein applying the capacitor comprises soldering the capacitor onto the upper conductive layer of the lower carrier substrate.

21. The method of claim 18, further comprising:
encapsulating the power semiconductor chip, the first electrically conductive spacer, the second electrically conductive spacer, the upper electrically conductive element and the lower carrier substrate in an encapsulation body,
wherein the encapsulation body comprises a molding compound.

* * * * *